(12) United States Patent
Itatani et al.

(10) Patent No.: US 7,345,326 B2
(45) Date of Patent: Mar. 18, 2008

(54) ELECTRIC SIGNAL TRANSMISSION LINE

(75) Inventors: Taro Itatani, Tsukuba (JP); Shuichi Yagi, Isesaki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/514,721

(22) PCT Filed: May 24, 2002

(86) PCT No.: PCT/JP02/05071

§ 371 (c)(1),
(2), (4) Date: Oct. 20, 2005

(87) PCT Pub. No.: WO03/091084

PCT Pub. Date: Nov. 6, 2003

(65) Prior Publication Data

US 2006/0082937 A1    Apr. 20, 2006

(51) Int. Cl.
*H01L 29/778* (2006.01)
(52) U.S. Cl. .............................. 257/194; 257/E29.059; 257/107; 257/173; 257/355; 257/367; 357/22; 357/16
(58) Field of Classification Search ........ 257/E29.194, 257/734, 173, 107, 355, 367, 275, E29.059, 257/E29.043, 194; 361/56; 357/16, 22, 357/58
See application file for complete search history.

(56) References Cited

U.S. PATENT DOCUMENTS 4,547,681 A * 10/1985 Egawa ........................ 327/74
4,647,472 A * 3/1987 Hiraki et al. ................ 438/778
4,727,403 A * 2/1988 Hida et al. .................. 257/194
4,839,703 A * 6/1989 Ohata et al. ................. 257/192

(Continued)

FOREIGN PATENT DOCUMENTS

EP    0 311 406    4/1989

(Continued)

OTHER PUBLICATIONS

Herrick, Katherine Juliet et al. "Si-Micromachined Coplaner Waveguides for Use in High-Frequency Circuits", IEEE Transactions on Microwave Theory and Techniques, vol. 46, No. 6, pp. 762-768 1998.

(Continued)

*Primary Examiner*—Jerome Jackson
*Assistant Examiner*—Chris Chu
(74) *Attorney, Agent, or Firm*—Oblon, Spivak, McClelland, Maier & Neustadt, P.C.

(57) ABSTRACT

An electric signal transmission line includes a signal electrode portion, a ground electrode portion and a dielectric portion formed on a semiconductor substrate. The signal electrode portion has a metal electrode through which an electric signals flows. The ground electrode portion has a grounded metal electrode. The metal electrode of the signal electrode portion and the metal electrode of the ground electrode portion are connected with a semiconductor PN junction. The dielectric portion is formed by using a dielectric to cover a region between the metal electrode of the signal electrode portion and the metal electrode of the ground electrode portion through which a line of electric force runs and is a region in which energy of transmitted electric signals exist.

6 Claims, 5 Drawing Sheets

U.S. PATENT DOCUMENTS

| | | | |
|---|---|---|---|
| 5,548,134 A * | 8/1996 | Tailliet | 257/173 |
| 6,274,908 B1 * | 8/2001 | Yamaguchi et al. | 257/355 |
| 6,469,325 B1 * | 10/2002 | Ishizuka et al. | 257/173 |
| 6,825,504 B2 * | 11/2004 | Ishizuka et al. | 257/173 |

FOREIGN PATENT DOCUMENTS

| | | |
|---|---|---|
| JP | 03-052302 | 3/1991 |
| JP | 11-195909 | 7/1999 |
| KR | 1999-0037222 | 5/1999 |

OTHER PUBLICATIONS

Rodwell, Mark J.W. et al. "Active and Nonlinear Wave Propagation Devices in Ultrafast Electronics and Optoelectronics", Proceedings of the IEEE, vol. 82, No. 7, pp. 1037-1059 1994.

Bhattacharya, U. et al. "DC-725 GHz Sampling Circuits and Subpicosecond Nonlinear Transmission Lines Using Elevated Coplaner Waveguide", IEEE Microwave and Guided Wave Letters, vol. 5, No. 2, pp. 50-52 1995.

* cited by examiner (a)

(b)

ELECTRIC SIGNAL TRANSMISSION LINE

TECHNICAL FIELD

This invention relates to an electric signal transmission line for propagating electric signals. It particularly relates to the structure of an electric signal transmission line for transmitting high-frequency electric signals in a semiconductor circuit.

BACKGROUND ART

The upper limit of the signal processing frequency for processing electric signals in an integrated circuit is determined by active elements, such as transistors, and passive elements, such as transmission lines. Although the transistor cut-off frequency as of 2002 has reached 500 GHz, because the upper limit of the signal processing frequency remains about 100 GHz, the upper limit of the signal processing frequency in an integrated circuit is around 100 GHz. High-frequency signals are propagated in microstrip waveguides in packaged substrates, and coplanar waveguides in semiconductor substrates.

FIG. 5 shows a structural cross-section of a microstrip line. The microstrip line comprises a signal electrode 101, a semiconductor substrate 102 and a ground electrode 103. Microstrip lines have the merit of being easy to construct and cheap to manufacture. However, although the propagation of an electric signal in a microstrip line takes place mostly in the semiconductor substrate 102, a portion of the electric signal exists in air on the signal electrode 101 side. The resulting difference in the phase velocity of the signal in the dielectric and in the air gives rise to a hybrid mode having electric and magnetic fields in the direction of propagation. In high-frequency wave regions, a hybrid mode is a predominant cause of radiation loss. Moreover, as the signal frequency increases, the signal wavelength decreases, manifesting the hybrid mode. Therefore, microstrip lines are not suitable for high-frequency transmission, and are mostly applied to packaged substrates where the frequencies are relatively low.

Coplanar waveguides will now be explained. FIG. 6 shows the cross-section of a coplanar waveguide. This coplanar waveguide comprises a signal electrode 105 and ground electrodes 106 disposed on a semiconductor substrate 104, with the signal electrode 105 arranged between the ground electrodes 106. An advantage of this configuration is that it is easy to mount semiconductor devices. Since the ground electrodes 106 are adjacent to the signal electrode 105, the electric signals are localized between the signal electrode 105 and the ground electrodes 106. Because of the spatial localization of the electric signals, a coplanar waveguide can cope with higher frequencies than a microstrip line. However, as in the case of a microstrip line, the signal is propagated in the semiconductor substrate 104 and in the air, giving rise to mismatched phase velocities. Consequently, a drawback is that as the frequency rises, the hybrid mode becomes manifest, increasing the radiation loss.

Next, a transmission line will be described that can transmit signals at higher frequencies than a microstrip line or coplanar waveguide. As of 2002, the line that can realize the highest signal transmission frequencies is said to be the nonlinear transmission lines (NLTLs) proposed by M. J. W. Rodwell. This is a type of active transmission line in which a capacitor is located between the signal and ground lines. An NLTL utilizes the non-linear nature of the capacitance relative to the voltage to compress electric pulses and enable transmission of high-frequency signals.

In the case of an NLTL, compression of the electric pulses has so far been achieved by utilizing the capacitance of Schottky junctions between metal and semiconductor (M. J. W. Rodwell et al., Proc. IEEE, vol. 82, No. 7, pp 1037-1059 (1994)). Also, by utilizing this active line, a prototype sampling circuit was fabricated that was capable of sampling signals at 725 GHz (U. Bhattacharya, S. T. Allen and M. J. W. Rodwell, IEEE, vol. 5, No. 2 (1995)).

FIG. 7 shows cross-sectional and plan views of this NLTL. Looking at the cross-sectional view of FIG. 7(a), it has a coplanar structure with a signal line on a semiconductor substrate 107 and ground lines at each side. The signal electrode 108 that constitutes the metal electrode of the signal line, and the ground electrodes 109 that constitutes metal electrode of the ground lines, contact N-type conductive semiconductor 110a and 110b. The ground electrodes 109 are in mutual contact via the N-type semiconductor 111. The N-type semiconductor 110a below the signal electrode 108 is insulated from the ground lines 109 and from the N-type semiconductor 111 by insulation layer 112. The ground lines 109 are each comprised of a main line 109a and a plurality of extended portions 109b that extend in the direction of the signal line 108 and form a Schottky junction (denoted by "SJ" in the drawing) with the N-type semiconductor 110a provided below the signal electrode 108.

In the NLTL thus configured, the extended portions 109b of the ground electrodes 109 generate an added inductance component. Obtaining a balance between the nonlinear capacitance produced by the Schottky junction and the added inductance component has a major effect on the electric pulse compression characteristics.

However, a signal propagated by an NLTL propagates in the semiconductor substrate and the air over the transmission line, so that, like in the case of a coplanar waveguide, an NLTL is an inhomogeneous waveguide. The difference in the phase velocity of the signal in the semiconductor substrate and in the air gives rise to a hybrid mode and generates electric and magnetic field components in the direction of propagation. In high-frequency wave regions, radiation loss caused by hybrid modes cannot be ignored.

In NLTLs, moreover, with respect to the signal electrodes, the nonlinear capacitance becomes a problem because it exists in the regions between the signal electrode and the ground electrodes. Since the energy of the electric signals propagating in an NLTL exists between the signal and ground electrodes, the use of numerous metal electrodes for Schottky junctions in that region produces impedance mismatches, producing reflection and scattering of traveling electromagnetic waves. With reference to the plane view of FIG. 7(b), for example, electromagnetic waves having a wavelength that is not greater than the gap between the electrodes forming the Schottky junction where there is an impedance mismatch suffer a major increase in loss due to multiple reflections.

In addition, the metal electrodes forming the Schottky junction have a boundary condition effect on propagating electric signals, complicating the signals and making it impossible to represent the transmission mode as analogous to TEM mode. There are also problems arising in the semiconductor manufacturing process due to the utilization of compound semiconductor Schottky barriers in NLTLs. The capacitance of a Schottky junction is determined by the height and thickness of the Schottky barrier. The thickness of a Schottky barrier is inversely proportional to the defect density at the compound semiconductor interface, and this defect density is highly dependent on the surface treatment method used: in current semiconductor manufacturing processes, uniform surface treatment cannot be reproduced. Thus, the difficulty in reproducing the size and uniformity of the nonlinear capacitance that is the critical parameter of an NLTL is a major problem in terms of practical utility.

In view of the above, an object of the present invention is to provide an electric signal transmission line that is capable of high-speed electric signal propagation and can be manufactured with stable quality using current semiconductor manufacturing processes.

DISCLOSURE OF THE INVENTION

In accordance with the present invention, the above object is attained by providing an electric signal transmission line, comprising a signal electrode portion, ground electrode portion and dielectric portion formed on a semiconductor substrate, the signal electrode portion having a metal electrode through which an electric signal flows and the ground electrode portion having a grounded metal electrode, the metal electrode of the signal electrode portion and the metal electrode of the ground electrode portion being connected by a semiconductor PN junction, and the dielectric portion being formed by using a dielectric to cover a region between the metal electrode of the signal electrode portion and the metal electrode of the ground electrode portion through which a line of electric force runs, i.e. a region in which the energy of the transmitted electric signals exists.

With the electric signal transmission line of this invention, the required capacitance between the signal electrode portion and the ground electrode portion is ensured by using a semiconductor PN junction to connect the metal electrode of the signal electrode portion with the metal electrode of the ground electrode portion, thereby making it possible to ensure the reproducibility and homogeneity of the electric signal transmission line using current semiconductor manufacturing processes that enable the impurity density to be controlled with good precision. Moreover, forming the dielectric portion by using a dielectric to cover the region in which the energy of the transmitted electric signals exists makes it possible to prevent an insulation breakdown or creeping discharge between the signal electrode portion and the ground electrode portion. In addition, having the major part of the signal propagation taking place in the dielectric also has the effect of suppressing signal attenuation.

In the electric signal transmission line, the ground electrode portion comprises two ground electrode portions provided respectively at opposite sides of the signal electrode portion and equipped with metal electrodes, the metal electrodes of the two ground electrode portions are connected by a first conductive semiconductor, a second conductive semiconductor having a different polarity to that of the first conductive semiconductor is allowed to intervene between the metal electrode of the signal electrode portion and the first conductive semiconductor to form a PN junction, and the metal electrode of the signal electrode portion and the metal electrodes of the ground electrode portion are connected in series with the PN junction and the first conductive semiconductor.

In accordance with the second mentioned electric signal transmission line of this invention, the metal electrode of the signal electrode portion and the metal electrodes of the ground electrode portions are connected in series with a capacitor implemented by the PN junction and a resistance implemented by the first conductive semiconductor. Thus, when the electric signal is a low-frequency signal, a voltage is generated by means of the PN junction capacitor, and when the signal is a high-frequency signal, a voltage is generated by the resistance. This makes it possible to effectively suppress fluctuations in the electric potential of the metal electrodes of the ground electrode portions from the electric signal supplied to the metal electrode of the signal electrode portion.

The second mentioned electric signal transmission line of this invention further comprises a space of an appropriate depth that is formed by etching between the metal electrode of the signal electrode portion and the metal electrodes of the ground electrode portion, that separates an exposed surface of the first conductive semiconductor from the region through which the line of electric force runs, and that is charged with a dielectric to form the dielectric portion that also covers the metal electrode of the signal electrode portion and the metal electrodes of the ground electrode portions.

In accordance with this electric signal transmission line, the first conductive semiconductor is separated from the region through which the electric power runs, located between the metal electrode of the signal electrode portion and the metal electrodes of the ground electrode portions. Therefore, even if an electromotive force is generated in the first conductive semiconductor by an electric signal supplied to the signal electrode portion, it is possible to suppress high-frequency-component attenuation, radiation and scattering arising from localized changes in boundary conditions in the metal electrode of the signal electrode portion, ensuring a high level of signal transmission reliability.

In any one of the electric signal transmission lines of this invention, the dielectric used to form the dielectric portion is an organic material having a dielectric constant of not more than 3.

The dielectric having a dielectric constant of not more than 3 means that the dielectric constant is sufficiently lower than that of an ordinary semiconductor, and at high frequencies can therefore provide a major contribution to reducing dielectric loss.

In the electric signal transmission line just mentioned above, the dielectric used to form the dielectric portion is formed of polyimide.

Using a polyimide to form the dielectric portion ensures a high insulation property, good resistance to high temperatures and chemicals, and good mechanical characteristics, thereby helping to improve the reliability of the electric signal transmission line. With respect also to the time and cost required to form the dielectric portion, polyimide is much more advantageous than silicon oxide, diamond carbon and other inorganic materials.

Further features of the invention, its nature and various advantages will be more apparent from the accompanying drawings and following detailed description of the invention.

BEST MODE FOR CARRYING OUT THE INVENTION

An embodiment of the electric signal transmission line according to the present invention will now be described with reference to the accompanying drawings.

Figure 1:
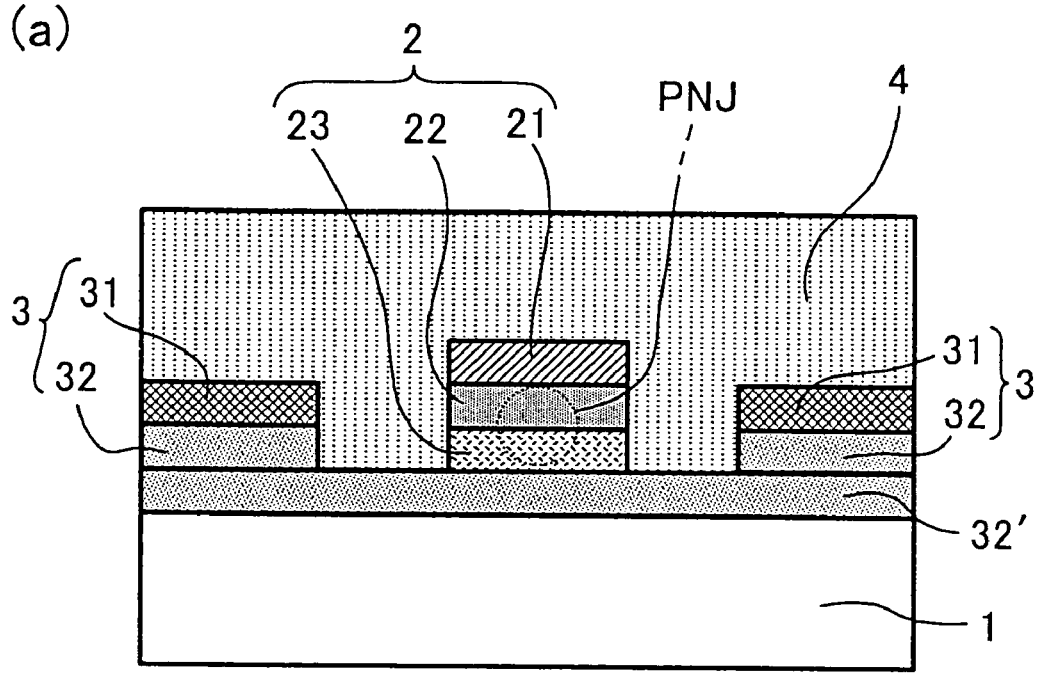
FIG. 1(a) is a schematic cross-sectional view of an electric signal transmission line according to an embodiment of the invention.
FIG. 1(b) is a schematic plan view of the electric signal transmission line according to the embodiment of the invention.
Figure 1:
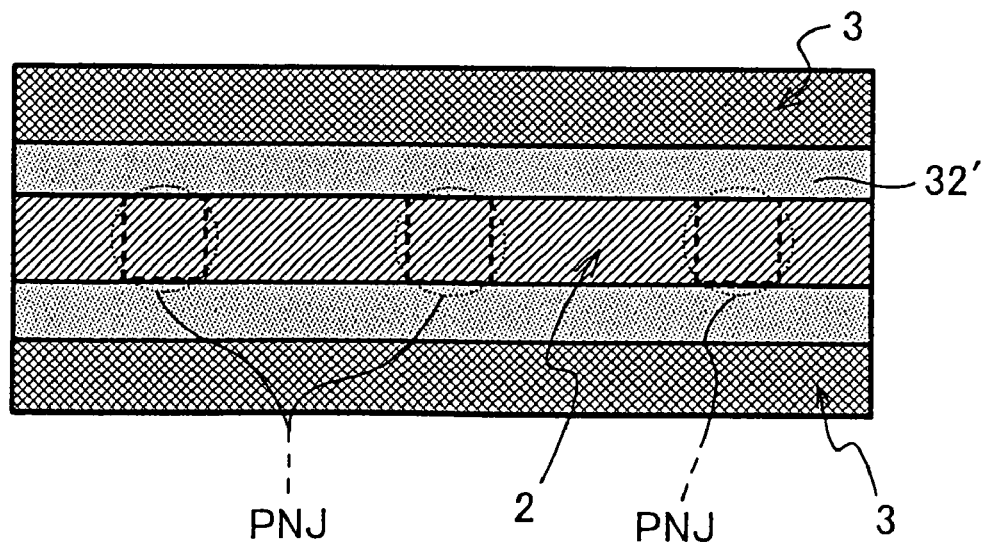

FIG. 1(a) shows the cross-section of the structure of an electric signal transmission line according to an embodiment of the invention, and FIG. 1(b) shows a plan view thereof (not including the top-most layer, which is the dielectric portion). The electric signal transmission line comprises a signal electrode portion 2, ground electrode portions 3 and a dielectric portion 4, formed on a substrate 1 of a semiconductor (such as silicon: Si, indium phosphide: InP, gallium nitride: GaN, silicon carbide: SiC and the like). The signal electrode portion 2 includes a metal electrode 21 through which the electric signal flows, an upper conductive semiconductor 22 and a lower conductive semiconductor 23. The ground electrode portions 3 each include a grounded metal electrode 31 and a conductive semiconductor 32. There is a ground electrode portion 3 at each side of the signal electrode portion 2. The metal electrodes 31 are connected together, via the conductive semiconductors 32, by a conductive semiconductor 32'.

There is an ohmic contact between the metal electrode 21 and the upper conductive semiconductor 22, and the upper conductive semiconductor 22 and lower conductive semiconductor 23 have opposing polarities. The upper conductive semiconductor 22 of the signal electrode portion 2 and the conductive semiconductors 32 and 32' of the ground electrode portion 3 also have different polarities (the polarities of the lower conductive semiconductor 23 and the conductive semiconductors 32 and 32' being the same). The metal electrode 21 is connected to each metal electrode 31 of the ground electrode portion 3 by a semiconductor PN junction (indicated by "PNJ" in the drawing). It is necessary to set the order of the P-type and N-type semiconductors so that a reverse voltage is imposed on the PN junction that corresponds to the signal potential level and ground electrode potential.

Although in this embodiment the signal electrode portion 2 is provided with an upper conductive semiconductor 22 and lower conductive semiconductor 23 having different polarities, the invention is not limited thereto. A PN junction can be obtained even if a lower conductive semiconductor 23 is not provided, but instead the upper conductive semiconductor 22 is formed on a conductive semiconductor 32' having the same polarity as the lower conductive semiconductor 23. However, in terms of device characteristics, it is effective to provide a separate lower conductive semiconductor 23 for PN junction formation purposes that is more highly doped than the conductive semiconductor 32', as in the case of this embodiment.

In the electric signal transmission line of this embodiment, the region between the metal electrode 21 of the signal electrode portion 2 and the metal electrodes 31 of the ground electrode portions 3 is etched to an appropriate depth, without etching away the conductive semiconductor 32' beneath each metal electrode 31. A dielectric is then used to form the dielectric portion 4 in the etched space between the metal electrodes 21 and 31, whereby the space is filled and covered by forming the dielectric portion 4 until it extends to an appropriate height above the metal electrodes 31.

In this way, the dielectric portion 4 thus formed comprises a dielectric that fills the region between the metal electrode 21 of the signal electrode portion 2 and the metal electrodes 31 of the ground electrode portions 3, covering the region and the electrodes, thereby covering the region through which the line of electric force runs in which the transmitted electric signal energy exists. Although in the case of this embodiment the dielectric portion 4 is formed by forming the dielectric to a uniform height, this is not limitative, provided a dielectric is disposed in the region between the metal electrodes 21 and 31 through which the line of electric force runs. There is also no particular limitation on the dielectric used to form the dielectric portion 4. For example, an inorganic material, such as silicon oxide or silicon carbide, can be used, or an organic material, such as diamond-like carbon or polyimide. Also, the dielectric portion 4 is not limited to being formed using a single dielectric. It may instead be formed using a plurality of dielectrics.

Figure 2:
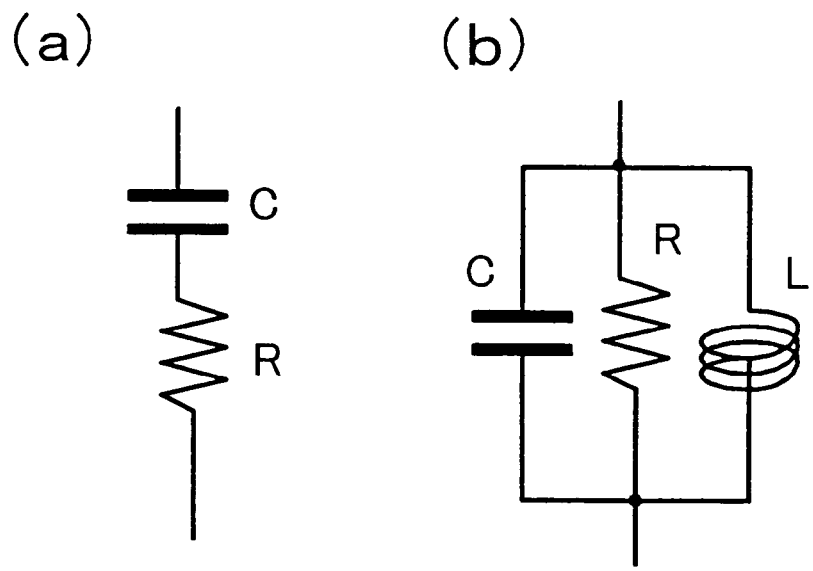
FIG. 2(a) shows an equivalent circuit between signal and ground eletrodes of the electric signal transmission line of the invention.
FIG. 2(b) shows an equivalent circuit between the Schottky junction electrodes of an NLTL.

Next, the function of the PN junction in the electric signal transmission line thus configured will be described. Between the metal electrode 21 and the metal electrodes 31 is a circuit, represented as an equivalent circuit, as shown in FIG. 2(a), comprising the PN junction capacitance C and the resistance R of the conductive semiconductors 32 and 32', connected in series. In FIG. 2(b), the corresponding connection in the case of an NLTL is shown in the form of an equivalent circuit comprising Schottky junction capacitance C and resistance R connected in parallel with the inductance L between the adjacent ground and signal electrodes.

In the case of the NLTL of FIG. 2(b), there are two problems when a high-frequency electric signal is applied to the signal line. One is the attenuation of the high-frequency signal component through the capacitance C, and the other is the fluctuation in the ground electrode potential due to the inductance component. Because the ground electrode of the Schottky junction is in the region in which the electric signal propagates, the propagating signal is affected by the fluctuations in the potential of the metal electrode on the ground side of the Schottky junction.

In contrast, since in the case of the electric signal transmission line of the invention, as shown in FIG. 2(a), the PN junction capacitance component and the resistance component of the conductive semiconductors 32 and 32' are in series, it is possible to prevent the low-frequency signal components being attenuated by the capacitance C and the high-frequency signal components being attenuated by the resistance R. Therefore, changes in signal electrode potential produced by an electric signal are absorbed by the capacitance C and the resistance R, and as a result, changes in the potential of the metal electrodes 31 are very small. The resistance characteristics of the conductive semiconductors 32 and 32' can be appropriately adjusted by adjusting the impurity doping concentrations and layer thicknesses.

Compared with the Schottky junction, an advantage of the PN junction is that it is possible to reproducibly achieve uniform characteristics with good precision, using current semiconductor manufacturing process technology. Because the Schottky-junction-based capacitance depends on the defect density of the semiconductor interface, and the semiconductor interface defect density depends strongly on the semiconductor surface treatment, it is difficult to maintain reproducibility and uniformity. In contrast, a PN-junction-based capacitance depends on the impurity density of the junction, and as the impurity density can be precisely controlled with current semiconductor manufacturing process technology, it is possible to ensure device reproducibility and uniformity.

The need to charge the space between the metal electrode 21 of the signal electrode portion 2 and the metal electrodes 31 of the ground electrode portions 3 with a dielectric will now be described. If no dielectric is used, the major part of the signal will be propagated through the air-space between the metal electrodes 21 and 31. In such a case, a concentration of the electric field in the corners of the metal electrodes leads to discharges. Creeping discharge through the semiconductor surface is also generated. The voltages generated can be excessively high, particularly when high-frequency signals are being transmitted. Generally, the higher the frequency, the lower the dielectric breakdown voltage, so assuming a case in which electric signals are being transmitted at a high frequency, in order to prevent dielectric breakdown or creeping discharge, at the least it is necessary to charge the region between the metal electrodes 21 and 31 with a dielectric.

Also, as a secondary effect of providing the dielectric portion 4, since a dielectric has a higher permittivity than air, the electric field will become concentrated in the dielectric material, spatially containing a propagating electric signal. Thus, most of the electric signal is propagated in the dielectric, helping to reduce signal attenuation.

As described above, in the electric signal transmission line according to this embodiment of the invention, the metal electrode 21 of the signal electrode portion 2 and the metal electrode 31 of the ground electrode portion 3 are connected in series with a PN junction and conductive semiconductors 32 and 32', and the space between the electrodes 21 and 31 is charged with dielectric material to constitute the dielectric portion 4, resulting in a configuration that makes it possible to suppress variations in the electric potential of the ground electrode portions 3 and to suppress attenuation of the high-frequency component. That is to say, as the metal electrodes 21 and 31 are connected in series with the PN-junction-based capacitor and the conductive semiconductor 32' resistance, in the case of a low-frequency electric signal, the PN junction capacitor generates a voltage, while in the case of a high-frequency signal, a voltage is generated by the resistance. Thus, it is possible to suppress variations in the electric potential of the metal electrodes 31 of the ground metal portion 3 due to the electric signals supplied to the metal electrode 21 of the signal electrode portion 2. Furthermore, the exposed surface of the conductive semiconductor 32' is spatially isolated from the region between the metal electrodes 21 and 31 through which the electric power runs by a space, and the space is charged with a dielectric to form a dielectric portion 4 that covers the electrodes 21 and 31. Thus, the dielectric portion 4 is spatially separated from the PN junction that electrically connects the dielectric portion 4 and the signal and ground electrode portions 2 and 3, and from the conductive semiconductors 32 and 32' connected to the PN junction, making it possible to suppress high-frequency-component attenuation, radiation and scattering arising from localized changes in the boundary conditions of the metal electrode 21. This makes it possible to realize an electric signal transmission line suitable for transmitting high-frequency signals, and which can be applied as a high-speed electric circuit.

Figure 3:
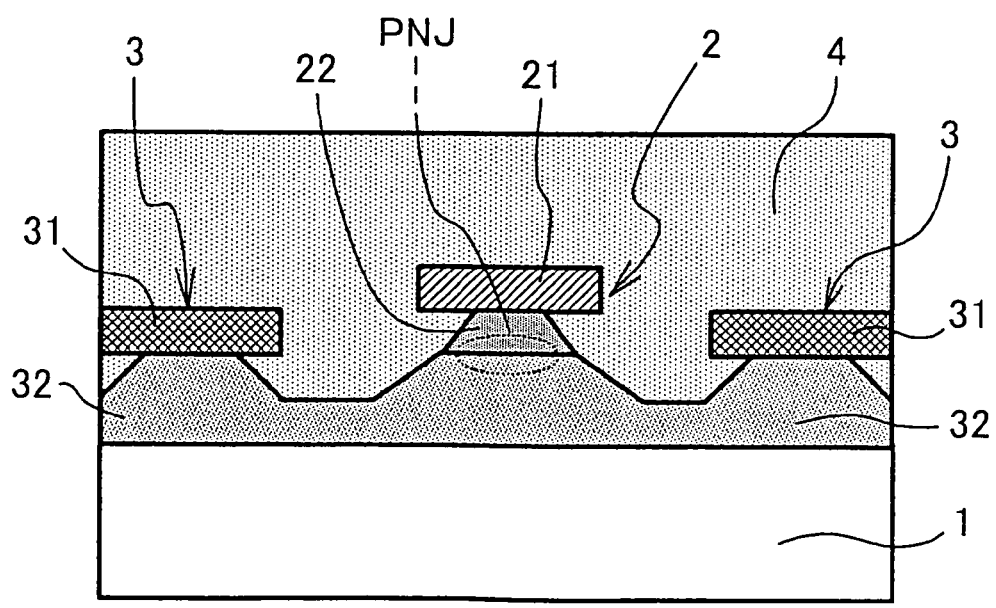
FIG. 3 is a schematic cross-sectional view of an electric signal transmission line manufactured as an embodiment prototype.

An embodiment of the fabricated electric signal transmission line will be described. FIG. 3 schematically shows a cross-sectional structural view of the embodiment. The embodiment uses a semi-insulation GaAs semiconductor substrate 1 having a thickness of 300 µm, and the respective metal electrodes 21 and 31 of the signal electrode portion 2 and ground electrode portions 3 are each 6 µm wide. Below the metal electrode 21, P-type GaAs semiconductor was used to form an upper conductive semiconductor 22 having a thickness of 1000 nm. Formed beneath that is a conductive semiconductor 32 of N-type GaAs that is 2000 nm thick and which also functions as the lower conductive semiconductor 23. A PN junction is formed between the electrodes 21 and 31.

The region between the metal electrode 21 and each of the metal electrodes 31 was wet-etched to a depth of 2 µm. Side-etching was used to etch the conductive semiconductors (the upper conductive semiconductor 22 and conductive semiconductor 32) at a sloping angle. Photosensitive polyimide having a low permittivity was then used to give the device a dielectric coating about 3 µm thick.

Polyimide is an organic material that is already used in integrated circuits as insulation filler for microstructures. Polyimide itself has good electrical insulation properties and mechanical characteristics, as well as good resistance to high temperatures and chemicals. It has a relative permittivity of 3, which is about one-quarter the 12.4 relative permittivity of GaAs. The smallness of its relative permittivity, compared with semiconductor material, makes it possible to greatly reduce dielectric loss. Dielectric loss is proportional to the square of the frequency, helping to decrease dielectric loss, which rises at high frequencies. When the fill coating has a thickness of 5 µm or more, as in the case of this embodiment, using polyimide to form the dielectric portion is quicker and cheaper than using silicon oxide, diamond carbon and other such inorganic materials.

Figure 4:
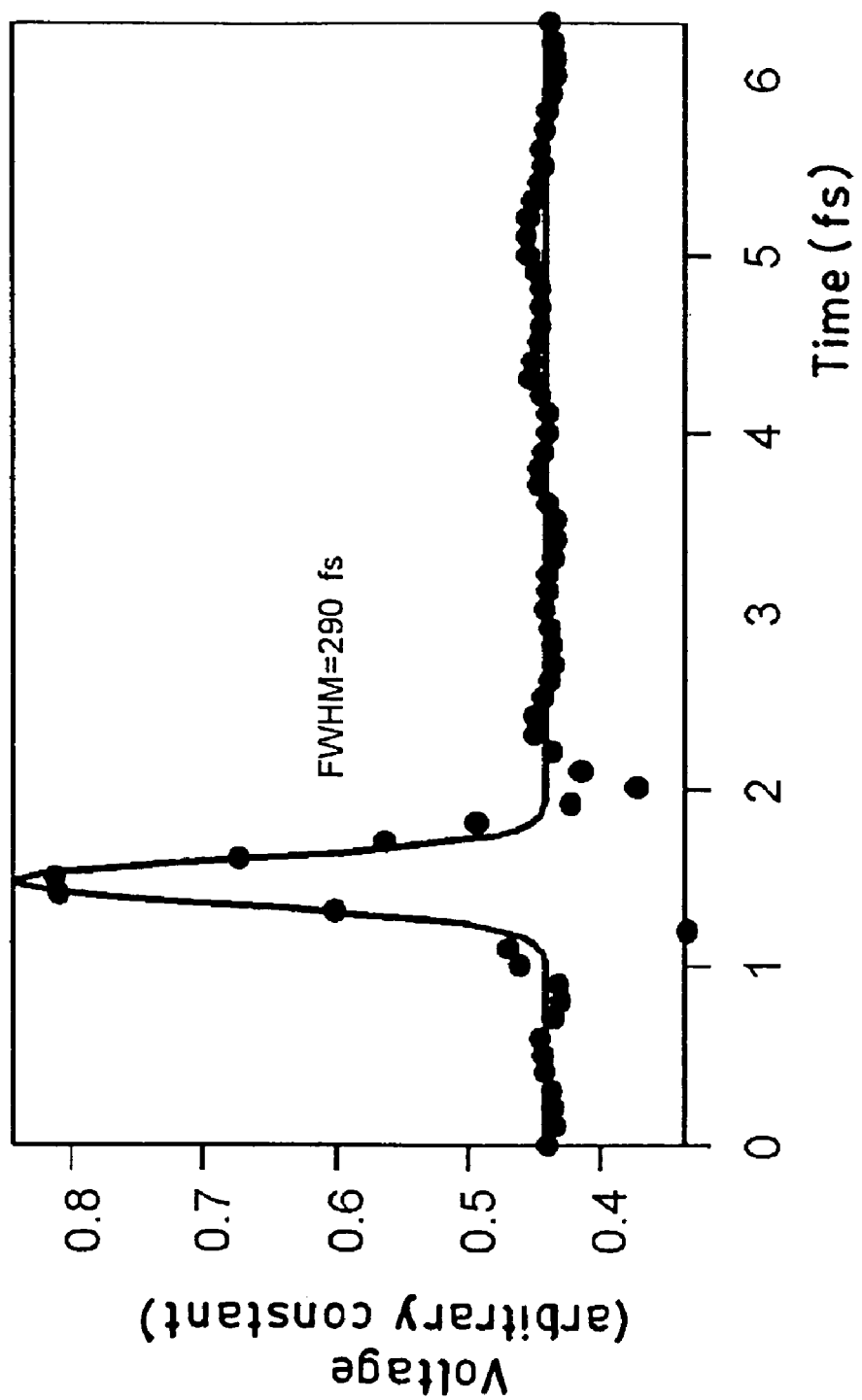
FIG. 4 is a waveform based on observations obtained from elements of an electric signal transmission line manufactured as an embodiment prototype.
Figure 5:
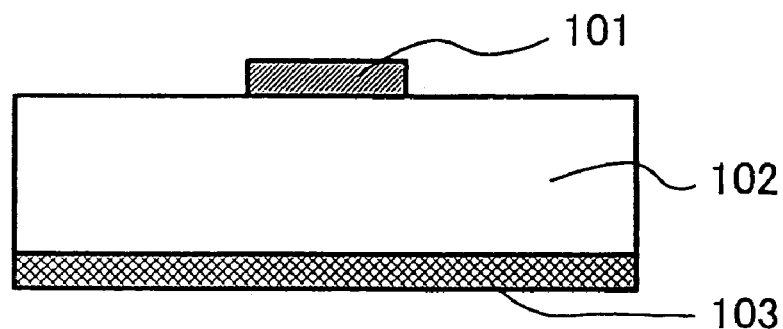
FIG. 5 is a schematic cross-sectional view of a microstrip line according to the prior art.
Figure 6:
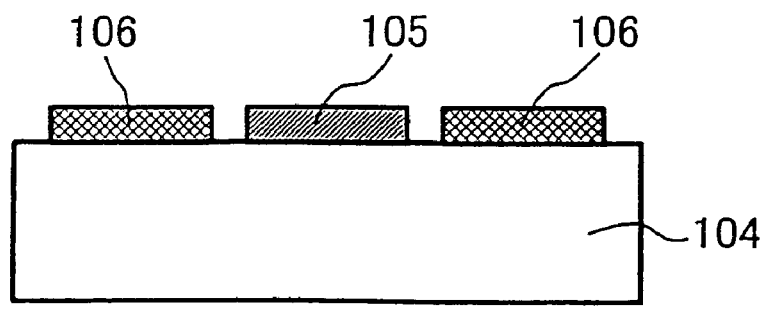
FIG. 6 is a schematic cross-sectional view of a coplanar waveguide according to the prior art.
Figure 7A:
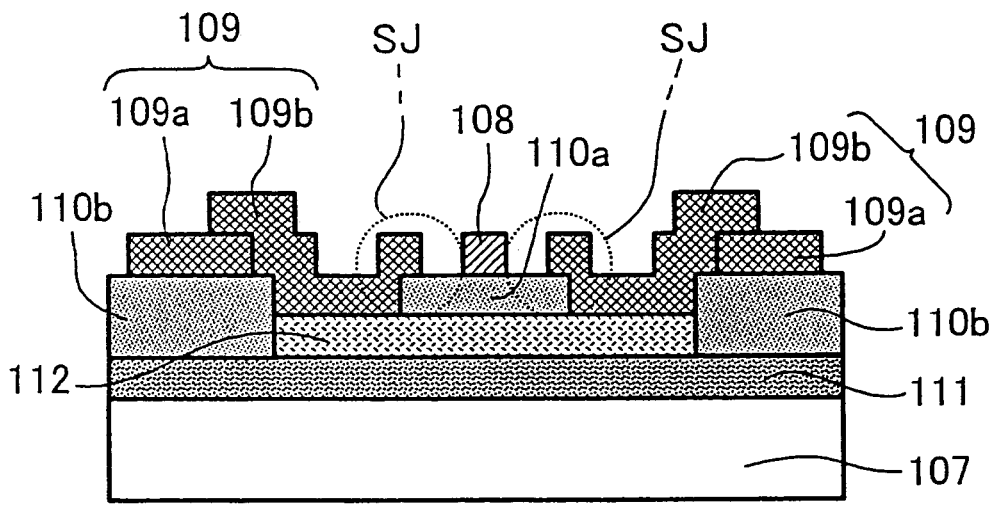
FIG. 7(a) is a schematic cross-sectional view of an NLTL.
Figure 7B:
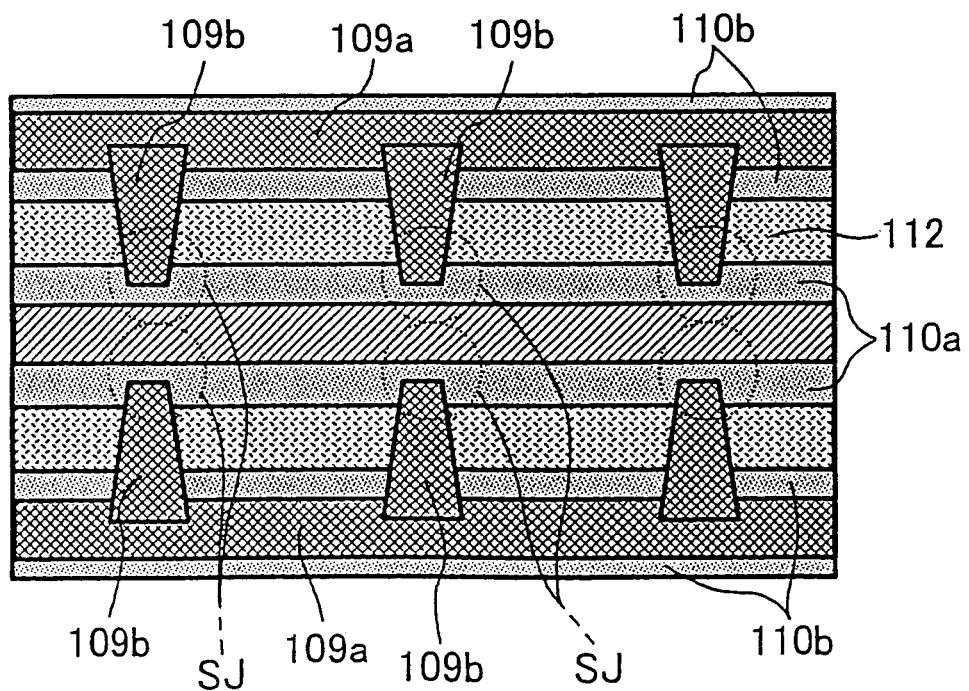
FIG. 7(b) is a schematic plan view of the NLTL.

A high-speed light-receiving element was integrated with the device thus trial-fabricated using the above electric signal transmission line. Measurements taken above the device at a distance of 50 µm from the light-receiving element showed a very-high-speed response of 290 fs (see FIG. 4). This is equivalent to a frequency of 10000 GHz, a high-speed response about 1.5 times faster than the 700 GHz sampling frequency of an NLTL. This frequency response exceeds what is currently said to be the fastest transistor operating speed, showing that it has the potential to greatly increase the upper limit of the signal processing frequency of integrated circuits.

INDUSTRIAL APPLICABILITY

As described in the foregoing, the electric signal transmission line of this invention is materialized with a technology that is suitable for application to the transmission of high-frequency electric signals, and can be manufactured with stable quality, using current semiconductor manufacturing process technology. Thus, it can make it possible to achieve higher-speed electric circuits by increasing the signal processing frequency, which is a bottleneck in integrated circuits.

The invention claimed is:

1. An electric signal transmission line, comprising:
a semiconductor substrate;
a signal electrode portion formed over the semiconductor substrate and including a lower conductive semiconductor, an upper conductive semiconductor formed on the lower conductive semiconductor, having a polarity different from that of the lower conductive semiconductor and forming a PN junction in conjunction with the lower conductive semiconductor, and a metal electrode which is formed on the upper conductive semiconductor and through which an electric signal flows;
two ground electrode portions provided respectively at opposite sides of the signal electrode portion over the semiconductor substrate and each including a conductive semiconductor having a polarity identical with that of the lower conductive semiconductor and a metal electrode formed on the conductive semiconductor and grounded;
a first conductive semiconductor having a polarity identical with that of the conductive semiconductor of the two ground electrode portions, connecting the signal electrode portion and two ground electrode portions to each other and to the semiconductor substrate;
a dielectric portion having a dielectric that covers a region between the metal electrode of the signal electrode portion and the metal electrodes of the two ground electrode portions, through which a line of electric force runs and which is a region in which energy of transmitted electric signals exists.

2. An electric signal transmission line according to claim 1, further comprising a space of an appropriate depth that is formed by etching between the metal electrode of the signal electrode portion and the metal electrodes of the ground electrode portion, that separates an exposed surface of the first conductive semiconductor from the region through which the line of electric force runs, and that is filled with a dielectric to form the dielectric portion that also covers the metal electrode of the signal electrode portion and the metal electrodes of the ground electrode portions.

3. An electric signal transmission line according to claims 1 or 2, wherein the dielectric used to form the dielectric portion is an organic material having a dielectric constant of not more than 3.

4. An electric signal transmission line according to claim 3, wherein the dielectric used to form the dielectric portion is formed of polyimide.

5. An electric signal transmission line according to claim 1, wherein the lower conductive semiconductor is more highly doped than the first conductive semiconductor.

6. An electric signal transmission line according to claim 1, wherein the conductive semiconductor is formed on and in direct contact with a upper surface of the first conductive semiconductor and a lower surface of the first conductive semiconductor is in direct contact with the semiconductor substrate.

* * * * *

UNITED STATES PATENT AND TRADEMARK OFFICE
CERTIFICATE OF CORRECTION

| | | |
|---|---|---|
| PATENT NO. | : 7,345,326 B2 | Page 1 of 1 |
| APPLICATION NO. | : 10/514721 | |
| DATED | : March 18, 2008 | |
| INVENTOR(S) | : Itatani et al. | |

It is certified that error appears in the above-identified patent and that said Letters Patent is hereby corrected as shown below:

On the title page, Item (87), the PCT Publication information is incorrect. Item (87) should read:
-- (87)  PCT Pub. No.:   WO03/100861
         PCT Pub. Date:  Dec. 4, 2003 --

Signed and Sealed this

Twelfth Day of May, 2009

JOHN DOLL
*Acting Director of the United States Patent and Trademark Office*